United States Patent [19]

Shibata et al.

[11] Patent Number: 4,899,344

[45] Date of Patent: Feb. 6, 1990

[54] SEMICONDUCTOR LASER CONTROL APPARATUS

[75] Inventors: Isamu Shibata, Fuchu; Takahiro Asai, Yokohama; Kiyoto Nagasawa, Yokohama; Kenichirou Asada, Tokyo, all of Japan

[73] Assignee: Ricoh Co., Ltd., Tokyo, Japan

[21] Appl. No.: 279,211

[22] Filed: Dec. 2, 1988

[30] Foreign Application Priority Data

| Dec. 7, 1987 | [JP] | Japan | 62-308938 |
| Jan. 14, 1988 | [JP] | Japan | 63-4853 |
| Feb. 12, 1988 | [JP] | Japan | 63-30661 |
| Feb. 25, 1988 | [JP] | Japan | 63-43049 |

[51] Int. Cl.⁴ .............................................. H01S 3/13
[52] U.S. Cl. ....................................... 372/29; 372/31; 372/38
[58] Field of Search .............................. 372/29, 31, 38

[56] References Cited

U.S. PATENT DOCUMENTS

| 4,831,626 | 5/1989 | Watanabe et al. | 372/29 |
| 4,835,780 | 5/1989 | Sugimura et al. | 372/29 |
| 4,835,781 | 5/1989 | Shoji | 372/29 |

Primary Examiner—James W. Davie
Attorney, Agent, or Firm—Cooper & Dunham

[57] ABSTRACT

A semiconductor laser control apparatus for controlling an optical output of a semiconductor laser to a predetermined value comprises a switching part coupled in series with the semiconductor laser and controlled by an N-bit image signal, N constant current supply circuits coupled in parallel to each other and in series with the switching part for supplying currents to the switching part so that a driving current is supplied to the semiconductor laser from the switching part, a detector for detecting the optical output of the semiconductor laser and for outputting a detection signal indicative of the detected optical output, and a control part responsive to the detection signal from the detector for controlling the driving current by controlling the N constant current supply circuits so that the optical output of the semiconductor laser becomes the predetermined value.

20 Claims, 15 Drawing Sheets

LEVEL "1"   LEVEL "2"   LEVEL "3"   LEVEL "16"

FIG. 15
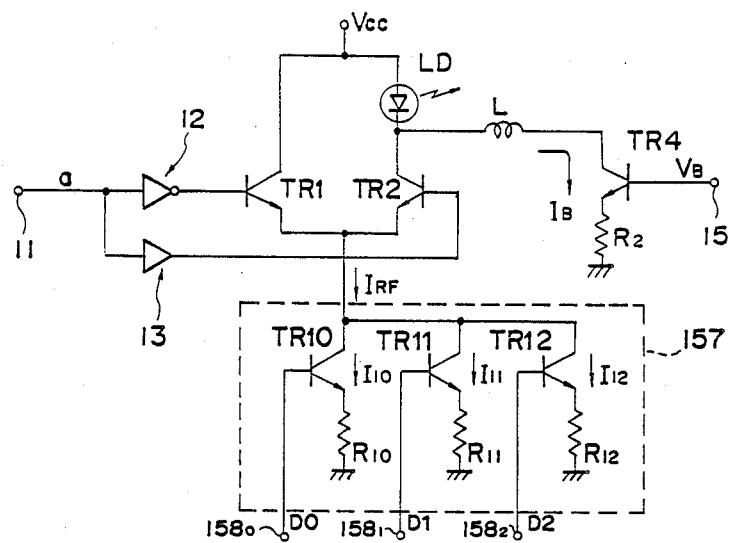
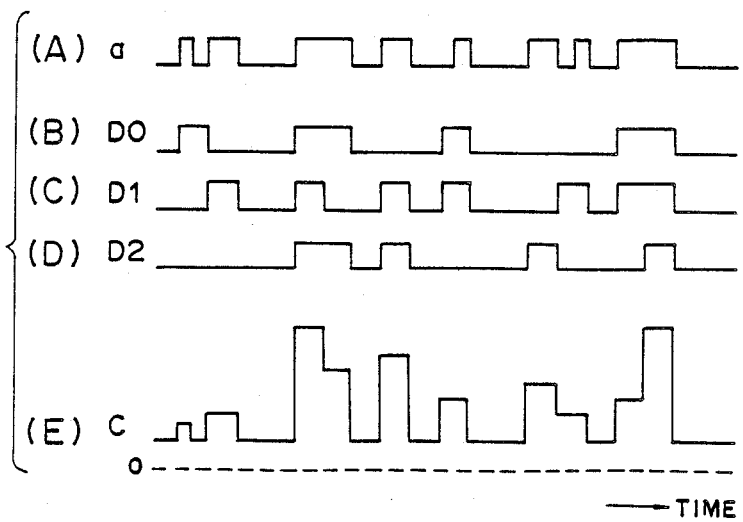
FIG. 16

LEVEL "1"   LEVEL "2"   LEVEL "3"   LEVEL "64"

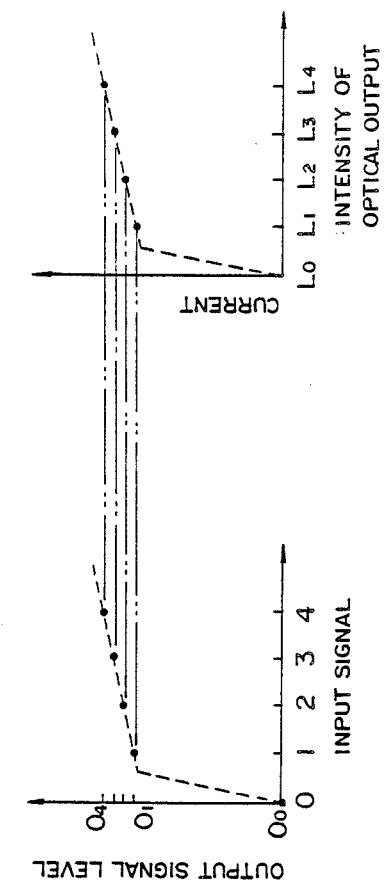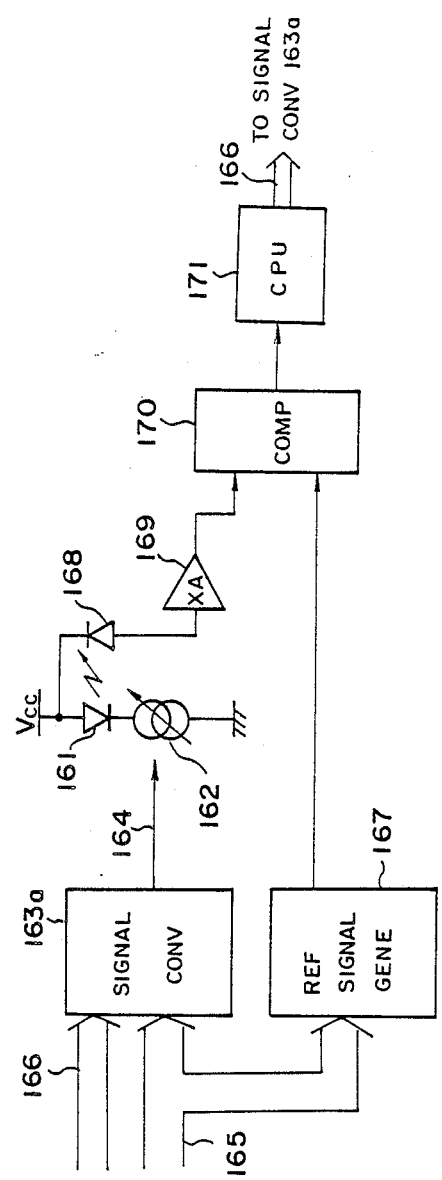

SEMICONDUCTOR LASER CONTROL APPARATUS

BACKGROUND OF THE INVENTION

The present invention generally relates to semiconductor laser control apparatuses, and more particularly to a semiconductor laser control apparatus for controlling a semiconductor laser which is used as a light source of a laser printer, an optical communication apparatus and the like.

As is well known, a semiconductor laser which is one of elements used as a light source has a driving current versus optical output characteristic shown in FIG. 1. As shown, the optical output of the semiconductor laser rises with a high fidelity to the driving current versus optical output characteristic beyond an oscillation threshold current Ith. In FIG. 1, t0 denotes an ambient temperature of the semiconductor laser, t1 denotes an ambient temperature higher than t0, L0 denotes a predetermined optical output of the semiconductor laser, Ith denotes a threshold current at a rise of the driving current versus optical output characteristic, and Ith' denotes a current at an intersection of zero optical output and an extension of the rising portion of the driving current versus optical output characteristic. In many cases, Ith' is used as the threshold current because Ith is difficult to measure in actual practice.

Hence, it is necessary to control the driving current of the semiconductor laser by use of a semiconductor laser control apparatus. A Japanese Laid-Open patent application No. 60-171863 discloses an example of the semiconductor laser control apparatus. According to this semiconductor laser control apparatus, the optical output of the semiconductor laser is detected in photodetector circuit and the detected optical output is compared with a reference value in a comparator. An up-down counter is controlled to make an up-count or a down-count depending on a result of the comparison outputted from the comparator, and the driving current of the semiconductor laser is set depending on a counted value of the up-down counter.

However, according to the above semiconductor laser control apparatus, the driving current is controlled for every predetermined time and the semiconductor laser is turned ON/OFF by an information signal thereby carrying out a two-level modulation. Since the semiconductor laser is subjected to the two-level modulation, the laser printer is limited to the printing with two gradation levels when this semiconductor laser is used as the light source and it is impossible to realize a printing with three or more gradation levels. In addition, when the semiconductor laser is used as the light source of an optical communication apparatus between a scanner and a printer and is controlled by the above semiconductor laser control apparatus, the optical communication apparatus cannot multiplex and transmit the information signal without increasing the transmission frequency.

As described above, the driving current of the semiconductor laser is set depending on the counted value of the up-down counter but the counted value of the up-down counter is outputted with reference to a timing with which the output signal of the comparator undergoes a transition from a low level or a high level. However, although the semiconductor laser control apparatus can control the optical output of the semiconductor laser to a predetermined value, the optical output is controlled with an aim merely to obtain a predetermined driving current during the operation of the semiconductor laser. In other words, when applied to the laser printer, measures are taken merely to obtain a predetermined optical output from the semiconductor laser when forming an image and it is only possible to distinguish whether or not an image exists. It is impossible to reproduce the gradation, halftone and the like of the image with a high fidelity, and there is a problem in that a reproduction with a high fidelity dependent on the state of the image cannot be achieved.

But the optical output of the semiconductor laser varies due to thermal coupling. For this reason, even when the driving current of the semiconductor laser is controlled by the above described semiconductor laser control apparatus, the optical output of the semiconductor laser once rises to a value greater than the predetermined optical output determined by the predetermined driving current when the semiconductor laser is turned ON and thereafter stabilizes to the predetermined optical output with a certain time constant. When the semiconductor laser is turned ON/OFF by a modulating signal shown in FIG. 2(A), for example, an optical output of the semiconductor laser becomes as shown in FIG. 2(C) responsive to a driving current shown in FIG. 2(B). As shown in FIG. 2(C), a change is introduced in the optical output.

When the change is introduced in the optical output of the semiconductor laser which is used as the light source of the laser printer, for example, there are problems in that inconsistencies are introduced in the gradation of the image and the halftones of the image cannot be reproduced with a high fidelity.

Recently, a digital copying machine which reads a document by charge coupled device (CCD) sensors and outputs an image data of the document to a laser printer for printing is becoming popular. The document which is copied on such a digital copying machine includes photographs and pictures having gradation. And when outputting to the laser printer the image data including gradation information, the known dither technique using the dither matrix is used to describe the gradation levels. In other words, one picture element is constituted by a $4\times 4$ matrix and each picture element is turned ON/OFF (two-level) so as to describe the gradation in 16 ($=4\times 4$) gradation levels.

In a case where it is necessary to describe the gradation in a large number of gradation levels, the size of the dither matrix is increased. For example, a $8\times 8$ dither matrix is used to describe the gradation in 64 gradation levels. However, according to this method, the picture elements become coarse because of the need to increase the size of the dither matrix when the gradation levels of the gradation which is to be described increases and there is a problem in that the resolution becomes poor.

FIG. 3 shows an example of the conventional semiconductor laser control apparatus, and FIGS. 4(A) through 4(C) are timing charts for explaining the operation of this conventional semiconductor laser control apparatus.

In FIG. 3, an image signal (or data) is applied to an input terminal 11 and supplied to a base of a transistor TR1 through an inverter 12. The image signal is also supplied to a base of a transistor TR2 through a non-inverter 13. A collector of a transistor TR3 is connected to emitters of the transistors TR1 and TR2, and an emitter of the transistor TR3 is grounded through a resistor R1. A voltage $V_{RF}$ is applied to a terminal 14 and supplied to a base of the transistor TR3. The transistor TR3 and the resistor R1 constitute a constant current supply circuit.

A collector of the transistor TR1 is connected to a power source for supplying a power source voltage Vcc, and a collector of the transistor TR2 is coupled to the power source through a semiconductor laser LD. The collector of the transistor TR2 is also coupled to a collector of a transistor TR4 through a coil L. An emitter of the transistor TR4 is grounded through a resistor R2, and a voltage $V_B$ is applied to a terminal 15 and supplied to a base of the transistor TR4.

When an image signal shown in FIG. 4(A) is applied to the input terminal 11, the transistors TR1 and TR2 are turned ON alternately. That is, the transistor TR1 is turned ON when the transistor TR2 is turned OFF and the transistor TR1 is turned OFF when the transistor TR2 is turned ON, and such turning ON/OFF of the transistors TR1 and TR2 is repeated. When the transistor TR2 is ON, a current $I_{RF}$ from the constant current supply circuit made up of the transistor TR3 and the resistor R1 and a bias current $I_B$ due to the transistor TR4 and the resistor R2 flow to the semiconductor laser LD. When the transistor TR2 is OFF, the bias current $I_B$ flows to the semiconductor laser LD. Accordingly, a pulse current shown in FIG. 4(B) flows through the semiconductor laser LD and the optical output of the semiconductor laser LD takes a pulse form as shown in FIG. 4(C). In FIGS. 4(B) and 4(C), phantom lines respectively denote a zero current and a zero output.

Hence, the semiconductor laser LD is modulated depending on a pulse width of the image signal applied to the input terminal 11. In order to obtain an image having the gradation described in a large number of gradation levels without sacrificing the resolution, it is possible to give two or more levels with respect to one dot by varying the modulation pulse width of the semiconductor laser LD. But such a description of the gradation is still insufficient.

SUMMARY OF THE INVENTION

Accordingly, it is a general object of the present invention to provide a novel and useful semiconductor laser control apparatus in which the problems described above are eliminated.

Another and more specific object of the present invention is to provide a semiconductor laser control apparatus for controlling an optical output of a semiconductor laser to a predetermined value comprising switching means coupled in series with the semiconductor laser and controlled by an N-bit image signal, N constant current supply circuits coupled in parallel to each other and in series with the switching means for supplying currents to the switching means so that a driving current is supplied to the semiconductor laser from the switching means, detector means for detecting the optical output of the semiconductor laser and for outputting a detection signal indicative of the detected optical output, and control means responsive to the detection signal from the detector means for controlling the driving current by controlling the N constant current supply circuits so that the optical output of the semiconductor laser becomes the predetermined value. According to the apparatus of the present invention, it is possible to carry out a multi-level modulation of the semiconductor laser. Hence, it is possible to realize a printer capable of printing the gradation in a large number of gradation levels and an optical communication apparatus capable of making a multiplex transmission of information signals. In addition, it is possible to carry out the multi-level modulation of the semiconductor laser with a high accuracy even when a driving current versus optical output characteristic of the semiconductor laser changes due to the temperature. Furthermore, when the image signal includes the gradation (or tone) information, it is possible to set the optical output of the semiconductor laser with a high fidelity to the image signal. Moreover, it is possible to reproduce an image from the image signal with a high fidelity so that a change in the optical output due to a thermal coupling is corrected.

Still another object of the present invention is to provide a semiconductor laser control apparatus for controlling an optical output of a semiconductor laser to a predetermined value comprising switching means coupled in series with the semiconductor laser and controlled by an image signal, variable current supply means coupled in series with the switching means for supplying a driving current to the semiconductor laser through the switching means, and terminal means for receiving data bits for controlling the variable current supply means. According to the apparatus of the present invention, it is possible to obtain a picture having a high resolution and described by a large number of gradation levels by use of the semiconductor laser.

A further object of the present invention is to provide a semiconductor laser control apparatus for controlling an optical output of a semiconductor laser to a predetermined value comprising first switching means coupled in series with the semiconductor laser and controlled by an image signal, variable current supply means coupled in series with the switching means for supplying a driving current to the semiconductor laser through the first switching means, second switching means coupled to the variable current supply means and supplied with a reference signal for selectively supplying the reference signal to the variable current supply means responsive to control signals, and terminal means for receiving data bits which are supplied to the second switching means as the control signals so as to control the driving current supplied from the variable current supply means.

Another object of the present invention is to provide a semiconductor laser control apparatus for controlling an optical output of a semiconductor laser to a predetermined value comprising signal converting means for converting a multi-level digital image signal into a current source control signal, and a variable current source for supplying a driving current to the semiconductor laser responsive to the current source control signal, where the signal converting means controls the variable current source by the current source control signal so that the driving current linearly corresponds to the multi-level digital image signal. According to the apparatus of the present invention, it is possible to positively maintain a linear relationship between the multi-level digital image signal and the optical output of the semiconductor laser.

Still another object of the present invention is to provide a semiconductor laser control apparatus for controlling an optical output of a semiconductor laser to a predetermined value comprising signal converting means supplied with a multi-level digital image signal and a conversion data for converting the multi-level digital image signal into a current source control signal based on the conversion data, a variable current source for supplying a driving current to the semiconductor laser responsive to the current source control signal, reference signal generating means supplied with the multi-level digital image signal for generating a reference signal which corresponds linearly to the multi-level digital image signal, detector means for detecting the optical output of the semiconductor laser and for outputting a detection signal indicative of the detected optical output, and control means responsive to the detection signal from the detector means for controlling the driving current by varying the conversion data so that levels of the detection signal and the reference signal coincide and the optical output of the semiconductor laser becomes the predetermined value, where the signal converting means controls the variable current source by the current source control signal so that the driving current linearly corresponds to the multi-level digital image signal. According to the apparatus of the present invention, it is possible to stabilize the optical output of the semiconductor laser even when a change occurs in the characteristic of the semiconductor laser. Especially in the case of a write system of a laser printer in which the signal is transmitted in blocks for each of the lines, the power setting of the semiconductor laser can be carried out between the two mutually adjacent lines.

Other objects and further features of the present invention will be apparent from the following detailed description when read in conjunction with the accompanying drawings.

BRIEF DESCRIPTION OF THE DRAWINGS

FIG. 15 is a circuit diagram showing a third embodiment of the semiconductor laser control apparatus according to the present invention;

FIGS. 16(A) through 16(E) are timing charts for explaining an operation of the third embodiment;

FIGS. 26A is a graph showing a multi-level digital signal versus current source control signal characteristic of the sixth embodiment;

FIG. 26B is a graph showing an intensity of optical output of the semiconductor laser versus driving current characteristic of the sixth embodiment;

FIG. 27 is a system block diagram showing a seventh embodiment of the semiconductor laser control apparatus according to the present invention;

DETAILED DESCRIPTION

Figure 5:
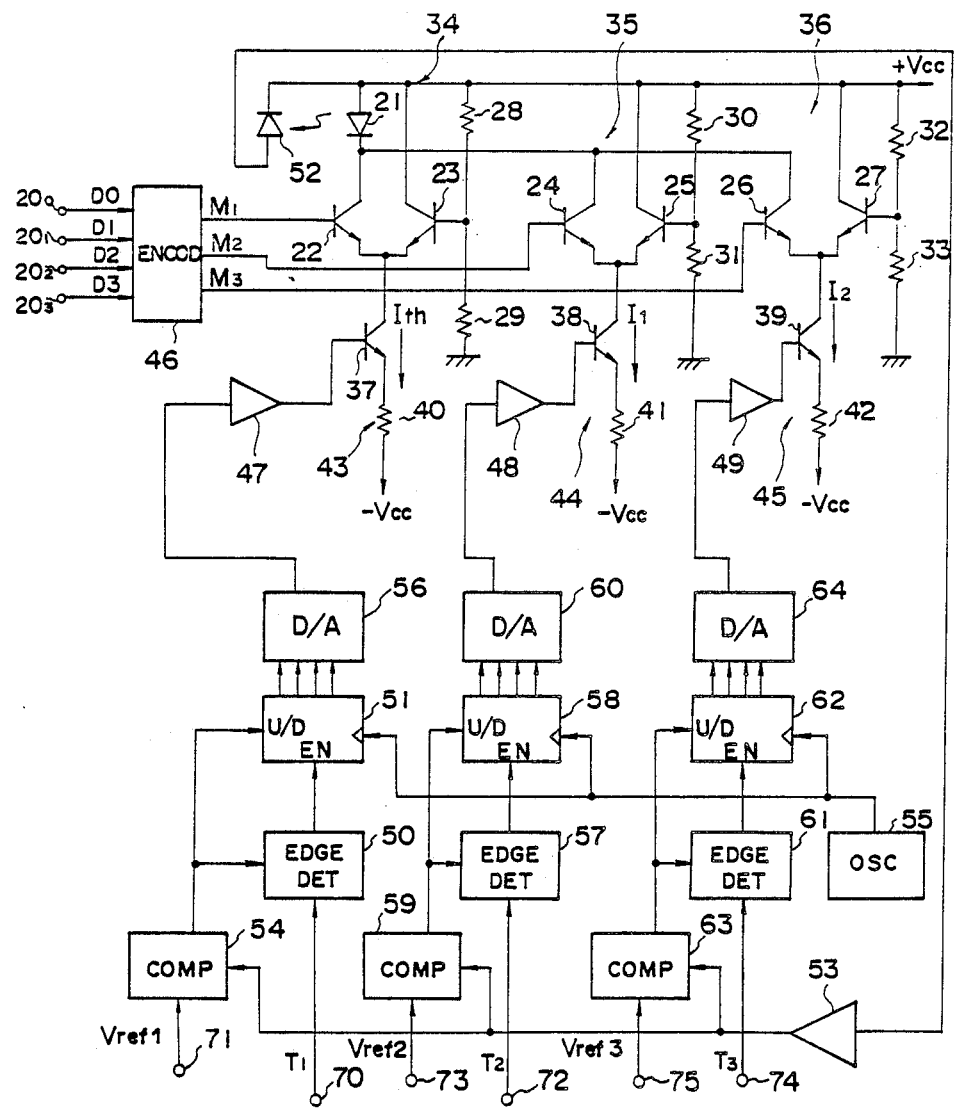
FIG. 5 is a circuit diagram showing a first embodiment of a semiconductor laser control apparatus according to the present invention.

FIG. 5 shows a first embodiment of a semiconductor laser control apparatus according to the present invention. For example, a semiconductor laser 21 is used as a light source of a raster scan type laser printer or a light source of an optical communication apparatus provided between a scanner and a raster scan type laser printer. Transistors 22 and 23 and resistors 28 and 29 constitute a differential circuit 34, transistors 24 and 25 and resistors 30 and 31 constitute a differential circuit 35, and transistors 26 and 27 and resistors 32 and 33 constitute a differential circuit 36. A transistor 37 and a resistor 40 constitute a constant current supply circuit 43, a transistor 38 and a resistor 41 constitute a constant current supply circuit 44, and a resistor 39 and a resistor 42 constitute a constant current supply circuit 45. +Vcc and −Vcc respectively denote positive and negative power source voltages.

In the differential circuits 34 through 36, the transistors 22, 24 and 26 coupled in series to the semiconductor laser 21 constitute switching elements for modulation. Bits D0 through D3 of an information signal are respectively applied to input terminals $20_0$ through $20_3$ and the information signal is converted into a 3-bit information signal in an encoder 46. The 3-bit information signal has bits M1 through M3 which are respectively applied to bases of the transistors 22, 24 and 26. The currents supplied from the constant current supply circuits 43 through 45 to the semiconductor laser 21 through the respective transistors 22, 24 and 26 are turned ON/OFF when the transistors 22, 24 and 26 are turned ON/OFF responsive to the bits M1 through M3, thereby carrying out a multi-level modulation.

In this case, the transistors 23, 25 and 27 of the respective differential circuits 34 through 36 are turned OFF when the transistors 22, 24 and 26 are turned ON responsive to the bits M1 through M3, and the currents from the constant current supply circuits 43 through 45 are supplied to the semiconductor laser 21 through the respective transistors 22, 24 and 26. In addition, the transistors 23, 25 and 27 of the respective differential circuits 34 through 36 are turned ON when the transistors 22, 24 and 26 are turned OFF responsive to the bits M1 through M3, and the currents from the constant current supply circuits 43 through 45 are supplied to the semiconductor laser 21 through the respective transistors 23, 25 and 27. In the differential circuits 47 through 49, output voltages of amplifiers 47 through 49 are supplied to bases of the respective transistors 37 through 39 and the transistors 37 through 39 respectively output currents Ith, I1 and I2 dependent on these voltages received at the bases.

Figure 6:
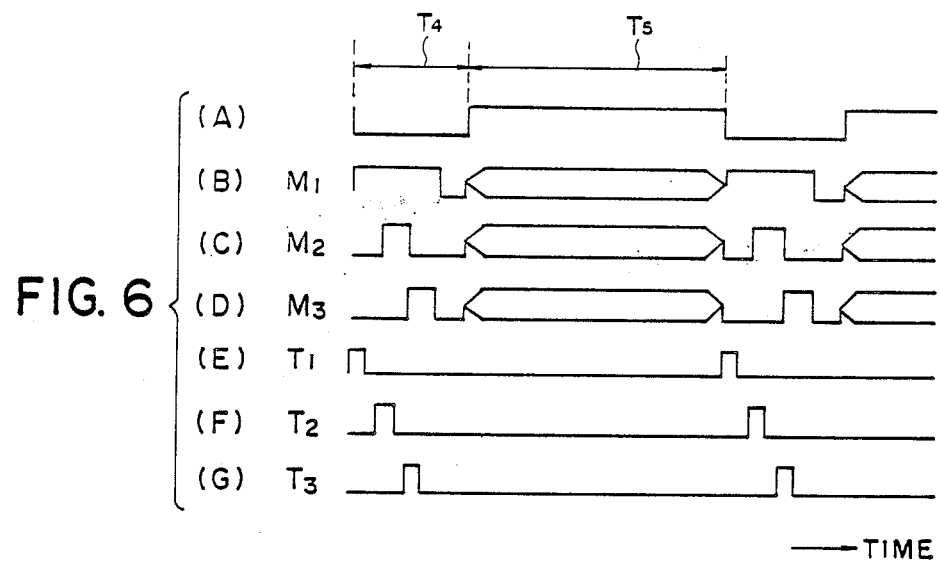
FIGS. 6(A) through 6(G) are timing charts for explaining an operation of the first embodiment.

In this embodiment, the turning ON/OFF of the transistors 22, 24 and 26 are successively controlled responsive to the information signal and the currents Ith, I1 and I2 are controlled so that the optical output of the semiconductor laser 21 becomes a predetermined value. When only the bit M1 applied to the base of the transistor 22 has a high level as shown in FIG. 6(B) and the bits M2 and M3 respectively applied to the bases of the transistors 24 and 26 have low levels as shown in FIGS. 6(C) and 6(D), only the current Ith flows from the constant current supply circuit 43 to the semiconductor laser 21. In this case, a timing signal T1 which rises to a high level with a timing shown in FIG. 6(E) is generated from a timing signal generating circuit (not shown) and supplied to an edge detection circuit 50 through a terminal 70. The edge detection circuit 50 detects a rising edge of the timing signal T1 and supplies an output signal to an enable terminal EN of an up-down counter 51, thereby enabling the up-down counter 51.

The optical output of the semiconductor laser 21 is converted into an electrical signal by a photodetector 52 which detects the optical output. An output signal of the photodetector 52 is amplified in an amplifier 53 and is supplied to a comparator 54 which compares the signal from the amplifier 53 with a reference voltage Vref1 which is obtained from a terminal 71. The comparator 54 outputs a binary signal indicating that the output signal of the amplifier 53 is greater than or less than the reference voltage Vref1. This binary signal from the comparator 54 is supplied to an up-down control terminal U/D of the up-down counter 51 to control the counting mode to one of the up-count and down-count modes. When the optical output of the semiconductor laser 21 is greater than a predetermined value and the output signal of the amplifier 53 is greater than the reference voltage Vref1, the up-down counter 51 is controlled to the down-count mode and counts down clock pulses generated from an oscillator 55. On the other hand, when the optical output of the semiconductor laser 21 is less than the predetermined value and the output signal of the amplifier 53 is less than the reference voltage Vref1, the up-down counter 51 is controlled to the up-count mode and counts up the clock pulse from the oscillator 55. An output signal of the up-down counter 51 is converted into an analog signal in a digital-to-analog (D/A) converter 56, and this analog signal is amplified by the amplifier 47 and supplied to the base of the transistor 37.

Accordingly, the current supplied from the constant current supply circuit 43 gradually changes proportionally to the counted value of the up-down counter 51, and the optical output of the semiconductor laser 21 gradually changes with the gradual change of this current.

When the optical output of the semiconductor laser 21 reaches the predetermined value and the logic level of the binary signal outputted from the comparator 54 changes, the edge detection circuit 50 detects this change (transition) and disables the up-down counter 51. Hence, the counter value of the up-down counter 51 is held, and an operation of controlling the optical output of the semiconductor laser 21 so that the output signal of the amplifier 53 becomes equal to the reference voltage Vref1 is completed. The edge detection circuit 50 may be designed to disable the up-down counter 51 by detecting only the rising edge or the falling edge of the binary signal outputted from the comparator 54.

On the other hand, when the bit M2 supplied to the base of the transistor 24 becomes high as shown in FIG. 6(C), the current I1 is supplied to the semiconductor laser 21 from the constant current supply circuit 44. When a timing signal T2 from the timing signal generating circuit supplied to an edge detection circuit 57 through a terminal 72 rises to a high level with a timing shown in FIG. 6(F), the edge detection circuit 57 detects a rising edge of the timing signal T2 and supplies an output signal to an enable terminal EN of an up-down counter 58 to enable the up-down counter 58.

The output signal of the amplifier 53 is supplied to a comparator 59 which compares this signal with a reference voltage Vref2 obtained from a terminal 73. An output binary signal of the comparator 59 is supplied to an up-down control terminal U/D of the up-down counter 58 to control the counting mode thereof. When the optical output of the semiconductor laser 21 is greater than a predetermined value and the output signal of the amplifier 53 is greater than the reference voltage Vref2, the up-down counter 58 is controlled to the down-count mode and counts down clock pulses generated from the oscillator 55. On the other hand, when the optical output of the semiconductor laser 21 is less than the predetermined value and the output signal of the amplifier 53 is less than the reference voltage Vref2, the up-down counter 58 is controlled to the up-count mode and counts up the clock pulses from the oscillator 55. An output signal of the up-down counter 58 is converted into an analog signal in a D/A converter 60, and this analog signal is amplified by the amplifier 48 and supplied to the base of the transistor 38.

Accordingly, the current supplied from the constant current supply circuit 44 gradually changes proportionally to the counted value of the up-down counter 58, and the optical output of the semiconductor laser 21 gradually changes with the gradual change of this current.

When the optical output of the semiconductor laser 21 reaches the predetermined value and the logic level of the binary signal outputted from the comparator 59 changes, the edge detection circuit 57 detects this change (transition) and disables the up-down counter 58. Hence, the counted value of the up-down counter 58 is held, and an operation of controlling the optical output of the semiconductor laser 21 so that the output signal of the amplifier 53 becomes equal to the reference voltage Vref2 is completed. The edge detection circuit 57 may be designed to disable the up-down counter 58 by detecting only the rising edge or the falling edge of the binary signal outputted from the comparator 59.

When the bit M3 supplied to the base of the transistor 26 becomes high as shown in FIG. 6(D), the current I2 is supplied to the semiconductor laser 21 from the constant current supply circuit 45. When a timing signal T3 from the timing signal generating circuit supplied to an edge detection circuit 61 through a terminal 74 rises to a high level with a timing shown in FIG. 6(G), the edge detection circuit 61 detects a rising edge of the timing signal T3 and supplies an output signal to an enable terminal EN of an up-down counter 62 to enable the up-down counter 62.

The output signal of the amplifier 53 is supplied to a comparator 63 which compares this signal with a reference voltage Vref3 obtained from a terminal 75. An output binary signal of the comparator 63 is supplied to an up-down control terminal U/D of the up-down counter 62 to control the counting mode thereof. When the optical output of the semiconductor laser 21 is greater than a predetermined value and the output signal of the amplifier 53 is greater than the reference voltage Vref3, the up-down counter 62 is controlled to the down-count mode and counts down clock pulses generated from the oscillator 55. On the other hand, when the optical output of the semiconductor laser 21 is less than the predetermined value and the output signal of the amplifier 53 is less than the reference voltage Vref3, the up-down counter 62 is controlled to the up-count mode and counts up the clock pulses from the oscillator 55. An output signal of the up-down counter 62 is converted into an analog signal in a D/A converter 64, and this analog signal is amplified by the amplifier 49 and supplied to the base of the transistor 39.

Accordingly, the current supplied from the constant current supply circuit 45 gradually changes proportionally to the counted value of the up-down counter 62, and the optical output of the semiconductor laser 21 gradually changes with the gradual change of this current.

When the optical output of the semiconductor laser 21 reaches the predetermined value and the logic level of the binary signal outputted from the comparator 63 changes, the edge detection circuit 61 detects this change (transition) and disables the up-down counter 62. Hence, the counted value of the up-down counter 62 is held, and an operation of controlling the optical output of the semiconductor laser 21 so that the output signal of the amplifier 53 becomes equal to the reference voltage Vref3 is completed. The edge detection circuit 61 may be designed to disable the up-down counter 62 by detecting only the rising edge or the falling edge of the binary signal outputted from the comparator 63.

The laser printer modulates the semiconductor laser 21 by the information signal and scans the photosensitive body such as a photosensitive drum by the optical output of the semiconductor laser 21. FIG. 6(A) shows a scan timing of a photosensitive body (not shown) of the laser printer, where T4 denotes a non-scan period in which the photosensitive body is not scanned and T5 denotes a scan period in which the photosensitive body is scanned. In this embodiment, the optical output of the semiconductor laser 21 is controlled (that is, the multi-level setting is made) by use of the bits M1 through M3 of the information signal outputted from the encoder 46 and the timing signals T1 through T3 outputted from the timing generating circuit during the non-scan period T4.

Figure 7:
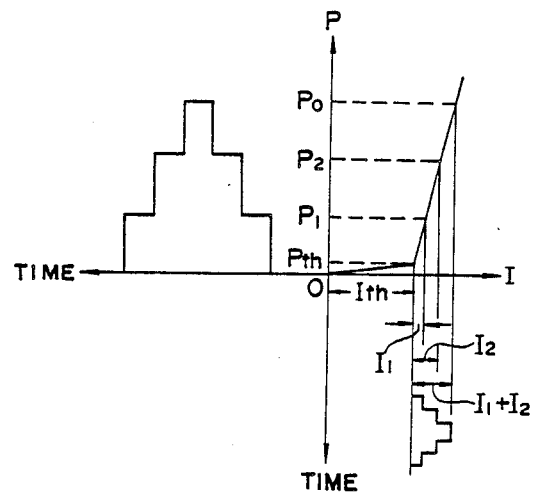
FIG. 7 shows a relationship between a driving current and an optical output of the semiconductor laser together with an example of a waveform.

FIG. 7 shows a relationship between a driving current I and an optical output P of the semiconductor laser 21 together with an example of a waveform. When the driving current I is greater than or equal to a predetermined current Ith, the driving current versus optical output characteristic becomes linear and multi-levels Pth, P1, P2 and P3 are set within this linear range.

The following Table shows a multi-level modulation state of this embodiment, where the same designations are used as in FIG. 7.

TABLE

| State | | I | II | III | IV | V |
|---|---|---|---|---|---|---|
| M1 | Ith | 0 | 1 | 1 | 1 | 1 |
| M2 | I1 | 0 | 0 | 1 | 0 | 1 |
| M3 | I2 | 0 | 0 | 0 | 1 | 1 |
| | P | 0 | Pth | P1 | P2 | P3 |

As shown in FIG. 6(A) and the above Table, the multi-level setting of the optical output of the semiconductor laser 21 is carried out during the non-scan period T4. When only the bit M1 has the high level, a high-level timing signal T1 is simultaneously received at the terminal 70 and is detected in the edge detection circuit 50. As a result, the current Ith from the constant current supply circuit 43 is supplied to the semiconductor laser 21 and the current Ith supplied by the constant current supply circuit 43 is controlled so that the output signal of the amplifier 53 becomes equal to the reference voltage Vref1. In this case, the reference voltage Vref1 is set so that the optical output of the semiconductor laser 21 becomes the predetermined value Pth as shown in FIG. 7, and the driving current I of the semiconductor laser 21 becomes Ith.

Next, when the bits M1 and M2 have the high levels, a high-level timing signal T2 is received at the terminal 72 and detected in the edge detection circuit 57. Consequently, the currents Ith and I1 from the respective constant current supply circuits 43 and 44 are supplied to the semiconductor laser 21 and the current I1 supplied by the constant current supply circuit 44 is controlled so that the output signal of the amplifier 53 becomes equal to the reference voltage Vref2. In this case, the reference voltage Vref2 is set so that the optical output of the semiconductor laser 21 becomes the predetermined value P1 as shown in FIG. 7, and the driving current I of the semiconductor laser 21 becomes Ith+I1.

Next, when the bits M1 and M3 have the high levels, a high-level timing signal T3 is received at the terminal 74 and detected in the edge detection circuit 61. Consequently, the currents Ith and I2 from the respective constant current supply circuits 43 and 45 are supplied to the semiconductor laser 21 and the current I2 supplied by the constant current supply circuit 45 is controlled so that the output signal of the amplifier 53 becomes equal to the reference voltage Vref3. In this case, the reference voltage Vref3 is set so that the optical output of the semiconductor laser 21 becomes the predetermined value P2 as shown in FIG. 7, and the driving current I of the semiconductor laser 21 becmes Ith+I2.

When scanning the photosensitive body to write information in the laser printer, the information signal describing the information to be written is supplied to the encoder 46 through the input terminals $20_0$ through $20_3$ and the semiconductor laser 21 is subjected to the multi-level modulation. In this case, the up-down counters 51, 58 and 62 are disabled and the counted values are held in the respective up-down counters 51, 58 and 62. The transistors 22, 24 and 26 are turned ON/OFF responsive to the bits M1 through M3 outputted form the encoder 46. As may be seen from the Table described before, the driving current I is "0" and the optical output P is "0" when all of the transistors 22, 24 and 26 are OFF. The driving current I becomes Ith and the optical output P becomes Pth when only the transistor 22 is ON. The driving current I is Ith+I1 and the optical output P is P1 when the transistors 22 and 24 are ON. The driving current I is Ith+I2 and the optical output P is P2 when the transistors 22 and 26 are ON. In addition, the driving current I is Ith+I1+I2 and the optical output P is P3 when the transistors 22, 24 and 26 are all ON.

Because the semiconductor laser 21 is subjected to the multi-level modulation, it is possible to realize a laser printer which can accurately print an image with a gradation described in a large number of gradation levels when the semiconductor laser 21 is used as a light source of the laser printer. In addition, when the semiconductor laser 21 is used as a light source of an optical communication apparatus which carries out transmission and reception of an information signal between a laser printer and a scanner, it is possible to make a multiplex transmission by carrying out the multi-level modulation of the semiconductor laser 21, thereby making it possible to realize a high-speed laser printer.

In the above described embodiment, the optical output P of the semiconductor laser 21 is controlled in the multi-levels to values Pth, P1 and P2 during the non-scan period T4. However, it is of course possible to carry out the multi-level modulation of the semiconductor laser 21 by controlling the optical output P to values Pth, P1 and P3 or to Pth, P2 and P0 since the values Pth, P1, P2 and P3 are within the linear range of the driving current versus optical output characteristic of the semiconductor laser 21.

Figure 8:
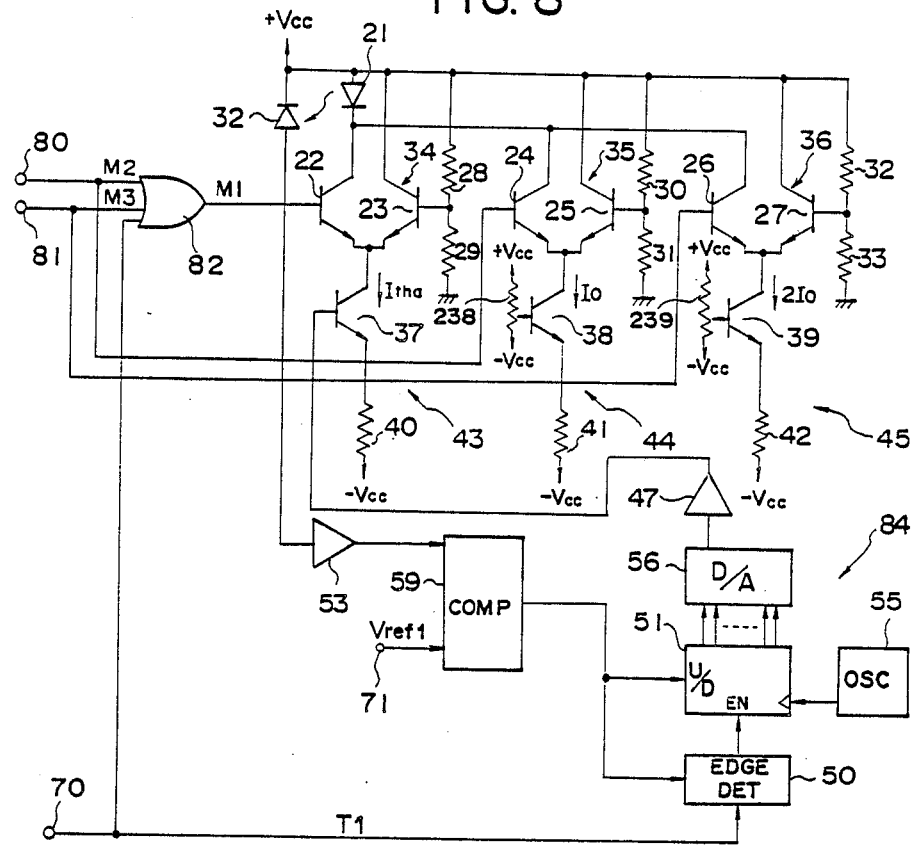
FIG. 8 is a circuit diagram showing a second embodiment of the semiconductor laser control apparatus according to the present invention.
Figure 9:
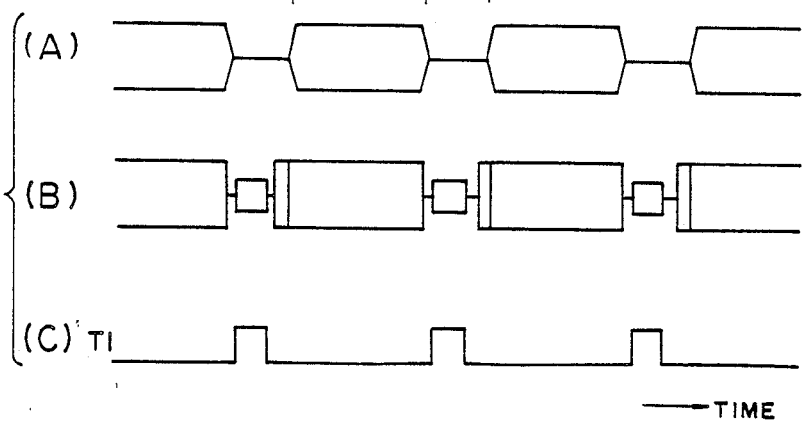
FIGS. 9(A) through 9(C) are timing charts for explaining an operation of the second embodiment.

Next, a description will be given of a second embodiment of the semiconductor laser control apparatus according to the present invention. FIG. 8 shows the second embodiment, and FIGS. 9(A) through 9(C) are timing charts for explaining an operation of the second embodiment. In FIG. 8, those parts which are essentially the same as those corresponding parts in FIG. 5 are designated by the same reference numerals, and a description thereof will be omitted.

In this embodiment, the constant current supply circuit 43 is used for supplying a bias current Itha to the semiconductor laser 21. A 2-bit image signal including the gradation information is applied to input terminals 80 and 81 and supplied to an OR circuit 82. This OR circuit 82 may be considered as a part of the encoder 46 of the first embodiment. The two bits of the image signal from the input terminals 80 and 81 are respectively supplied to the bases of the transistors 24 and 26 as the bits M2 and M3. In addition, an output signal of the OR circuit 82 is supplied to the base of the transistor 22 as the bit M1.

Appropriate voltages are supplied to the bases of the transistors 38 and 39 from respective variable resistors 238 and 239. The variable resistors 238 and 239 are respectively coupled between the power sources which respectively supply the power source voltages +Vcc and −Vcc.

For convenience' sake, the 2-bit image signal applied to the input terminals 80 and 81 will be referred to as a "code signal" in this embodiment. Hence, the driving current supplied to the semiconductor laser 21 from the constant current supply circuits 43 through 45 is dependent on a value of the code signal. In this embodiment, the code signal can take one of four values which are "0", "1", "2" and "3" because the code signal has two bits. The value of the code signal determines the driving current of the semiconductor laser 21 as follows.

In a case where the value of the code signal is "0", no driving current (that is, zero driving current) is supplied to the semiconductor laser 21 and no optical input (that is, zero optical output) is obtained from the semiconductor laser 21.

In a case where the value of the code signal is "1", a driving current IO+Itha is supplied to the semiconductor laser 21 and an optical output L0 is obtained from the semiconductor laser 21.

In a case where the value of the code signal is "2", a driving current 2IO+Itha is supplied to the semiconductor laser 21 and an optical output 2L0 is obtained from the semiconductor laser 21.

In a case where the value of the code signal is "3", a driving current 3IO+Itha is supplied to the semiconductor laser 21 and an optical output 3L0 is obtained from the semiconductor laser 21.

The currents supplied by the constant current supply circuits have such relationships that first and nth constant current supply circuits $Y_1$ and $Y_n$ other than the constant current supply circuit for supplying the bias current Itha supply currents which are IO and $2^{n-1} \times IO$, where n is greater than or equal to two and denotes the number of constant current supply circuits other than the constant current supply circuit for supplying the bias current Itha and IO denotes a basic current. Hence, in this embodiment, there are two constant current supply circuits other than the constant current supply circuit 43 for supplying the bias current Itha, namely, the constant current supply circuits 44 and 45. Hence, the constant current supply circuit 44 supplies the basic current IO and the constant current supply circuit 45 supplies a current 2IO ($=2^{2-1} \times IO$).

A correction circuit 84 for correcting a change in the optical output of the semiconductor laser 21 due to the thermal coupling is coupled to the differential circuit 34 and the constant current supply circuit 43 for supplying the bias current Itha. The correction circuit 84 includes the photodetector 32 for receiving the laser beam emitted to the rear of the semiconductor laser 21, the amplifier 53, the comparator 59, the edge detection circuit 50, the up-down counter 51, the oscillator 55, the D/A converter 56 and the amplifier 47.

The photodetector 32 outputs a current proportional to the intensity of the laser beam. This current from the photodetector 32 is converted into an appropriate voltage in the amplifier 53 and compared with the reference voltage Vrefl in the comparator 59. The output voltage of the comparator 59 has the high or low level depending on the level relationship of the two compared voltages, and this output voltage is supplied to the up-down control terminal U/D of the up-down counter 51 to control the counting mode thereof. For example, when the intensity of the laser beam emitted from the semicondutor laser 21 is lower than a predetermined value, a low-level voltage is outputted from the comparator 59 and the up-down counter 51 is controlled to the up-count mode.

The edge detection circuit 50 which controls the enable and disable states of the up-down counter 51 is coupled to the up-down counter 51. For example, a timing signal (or power set signal) T1 shown in FIG. 9(C) which has a low level during the scan period in which the optical output of the semiconductor laser 21 is used to scan the photosensitive body so as to record the image is applied to the terminal 70 and supplied to the edge detection circuit 50. FIG. 9(A) shows the image signal and FIG. 9(B) shows the optical output of the semiconductor laser 21. The edge detection circuit 50 is operated responsive to the timing signal T1 and detects the rising edge of the output voltage of the comparator 59 and enables or disables the up-down counter 51 depending on the level of the output voltage of the comparator 59.

Accordingly, in a case where the intensity of the laser beam received by the photodetector 32 is low when the high level timing signal T1 is obtained from the terminal 70 during the non-scan period, the rising edge of the output voltage of the comparator 59 is detected by the edge detection circuit 50 and the edge detection circuit 50 enables the up-down counter 51. Hence, the up-down counter 51 counts up the clock pulses from the oscillator 55. The counted value from the up-down counter 51 is converted into an analog signal in the D/A converter 56 and the analog signal is supplied to the base of the transistor 37 through the amplifier 47. The transistor 37 is a part of the differential circuit 34 which supplies the bias current Itha to the semiconductor laser 21. Thus, the semiconductor laser 21 is turned ON/OFF responsive to the modulated signal and the counted value of the up-down counter 51 gradually increases thereby gradually increasing the optical output of the semiconductor laser 21. During the scan period in which the photosensitive body is scanned by the optical output of the semiconductor laser 21, the level of the timing signal T1 becomes low and the up-down counter 51 is disabled by the edge detection circuit 50. This means that the adjustment of the optical output of the semiconductor laser 21 is discontinued when the adjustment is incomplete.

During the non-scan period, the level of the timing signal T1 becomes high. Hence, the up-down counter 51 is enabled by the edge detection circuit 50 and the adjustment of the optical output of the semiconductor laser 21 is resumed. Thereafter, when the level of the output voltage of the comparator 59 changes from the low level to the high level, this change (or transition) is detected by the edge detection circuit 50 and the up-down counter 51 is disabled. As a result, the up-down counter 51 holds the counted value and the magnitude of the driving current of the semiconductor laser 21 is maintained to a value corresponding to the held counted value.

On the other hand, when the output voltage of the comparator 59 has the high level when the up-down counter 51 is released from the disabled state and enabled, the up-down counter 51 is set to the down-count mode and counts down the clock pulses from the oscillator 55. Accordingly, the driving current of the semiconductor laser 21 decreases and the output voltage of the amplifier 53 decreases. When the output voltage of the amplifier 53 becomes less than the reference voltage Vref and the output voltage of the comparator 59 changes from the high level to the low level, the falling edge of the output voltage of the comparator 59 is detected in the edge detection circuit 50 and the up-down counter 51 is again disabled. Hence, the up-down counter 51 holds the counted value and the size of the driving current of the semiconductor laser 21 is maintained to a value corresponding to the held counted value.

In this embodiment, the timing signal T1 is generated with a timing corresponding to the non-scan period. However, the timing signal T1 may be generated with a timing in conformance with other systems.

Next, a description will be given of a third embodiment of the semiconductor laser control apparatus according to the present invention.

Figure 10:
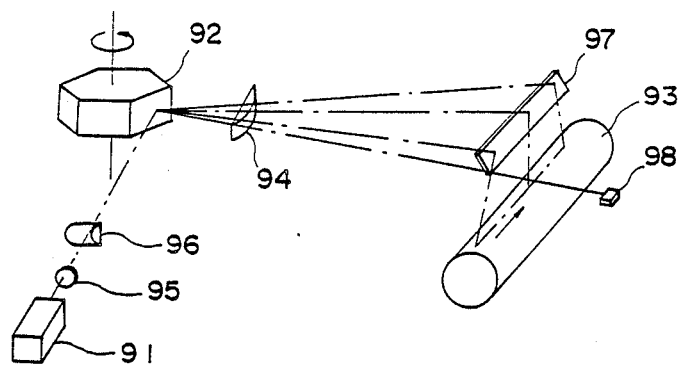
FIG. 10 is a perspective view showing an essential part of an optical system of a copying machine which may be applied with the present invention.

FIG. 10 shows an essential part of an optical system of a copying machine which may be applied with the present invention. The optical system includes a semiconductor laser 91, a polygonal mirror 92, a photosensitive drum 93, an $f\theta$ lens 94, a condenser lens 95, a cylindrical lens 96, a mirror 97, and a photodetector 98 for keeping a write starting position constant.

A laser beam emitted from the semiconductor laser 91 is formed into a parallel beam by the condenser lens 95, and the parallel beam is converged linearly on the polygonal mirror 92 by way of the cylindrical lens 96. The beam reflected by the polygonal mirror 92 is imaged on the photosensitive drum 93 through the $f\theta$ lens 94, and the beam scans the surface of the photosensitive drum 93 as the polygonal mirror 92 rotates.

Figure 11:
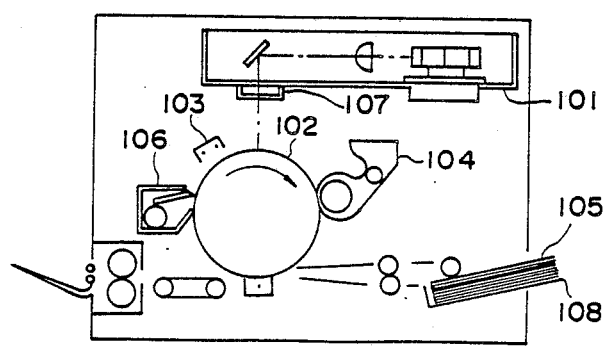
FIG. 11 is a cross sectional view showing the copying machine from a front thereof.

FIG. 11 shows a cross section of the copying machine having the optical system shown in FIG. 10. In FIG. 11, an optical system unit 101 includes the optical system shown in FIG. 10 in a form of a unit. The optical system unit 101 is provided with a protection glass 107 at a portion where the laser beam is outputted from the optical system unit 101. The optical system unit 101 has a sealed structure. A photosensitive drum 102 corresponds to the photosensitive drum 93 shown in FIG. 10. The copying machine further has a charger 103, a developer 104 and a cleaning unit 106, and sheets of paper 105 are stacked on a tray 108.

The photosensitive drum 102 is rotated in a direction of an arrow by a driving means (not shown) and is charged by the charger 103. Then, the photosensitive drum 102 is scanned and exposed by the laser beam outputted from the optical system unit 101 so as to form an electrostatic image on the surface of the photosensitive drum 102. The developer 104 develops the image to form a toner image on the surface of the photosensitive drum 102, and this toner image is transferred onto the paper 105. The residual toner remaining on the surface of the photosensitive drum 102 is cleaned and removed by the cleaning unit 106.

The copying machine described with reference to FIGS. 10 and 11 outputs a black and white image or an image formed with a predetermined color and the color of the paper depending on the color of the toner used.

Figure 12:
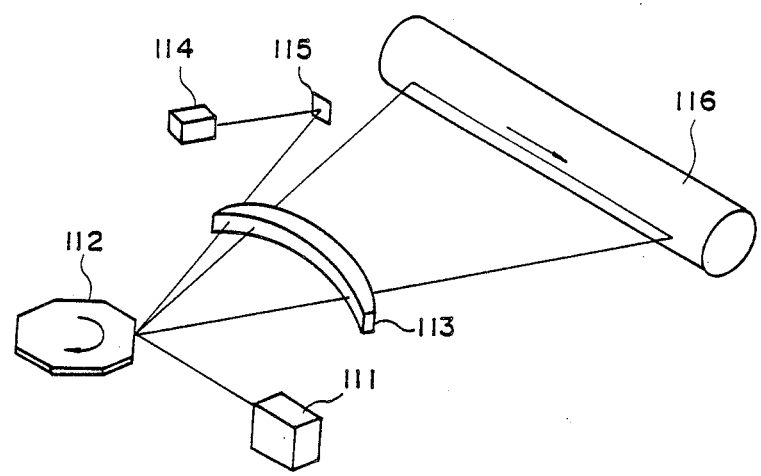
FIG. 12 is a perspective view showing an essential part of another optical system of a copying machine which may be applied with the present invention.

Next, a description will be given of a color printer which may be applied with the present invention. An optical system of the color printer is basically the same as the optical system shown in FIG. 10. FIG. 12 shows an essential part of an optical system of the color printer.

In FIG. 12, the optical system includes a semiconductor laser 111 which is modulated and driven by an image signal, a deflector 112, an imaging lens 113, a synchronous detection device 114, a mirror 115 and a photosensitive drum 116. The laser beam emitted from the semiconductor laser 111 is deflected by the deflector 112 and is imaged as a predetermined spot on the surface of the photosensitive drum 116 by way of the imaging lens 113. The predetermined spot has a certain diameter and scans along a predetermined scanning line on the photosensitive drum 116 so that the picture elements constituting the image become arranged at constant intervals.

Hence, when a deflector which rotates at an equiangular velocity such as a polygonal mirror and a rotating hollogram is used as the deflector 112, the imaging lens 113 has a f$\theta$ characteristic. In addition, an optical system (not shown) is generally provided to share the point of deflection and the point of image formation with respect to a sub scanning direction perpendicular to the scanning surface and to correct an error in the deflection surface.

Since the rotation of the deflector 112 is not perfectly constant and the deflection surface inevitably includes errors (imperfect portions), an error occurs in the main scanning direction for each scanning line thereby making the formed image poor when no means is provided to compensate for such errors in the rotation and the deflection surface of the deflector 112. For this reason, the synchronous detection device 114 having a photodetector with a high response speed is arranged to receive the laser beam reflected by the mirror 115. The write starting position is controlled responsive to an output signal of the synchronous detection device 114. As a result, the deviation of each scanning line along the main scanning direction is only caused by the imperfect rotation of the deflector 112 and a satisfactory image can be formed from the practical point of view.

Figure 13:
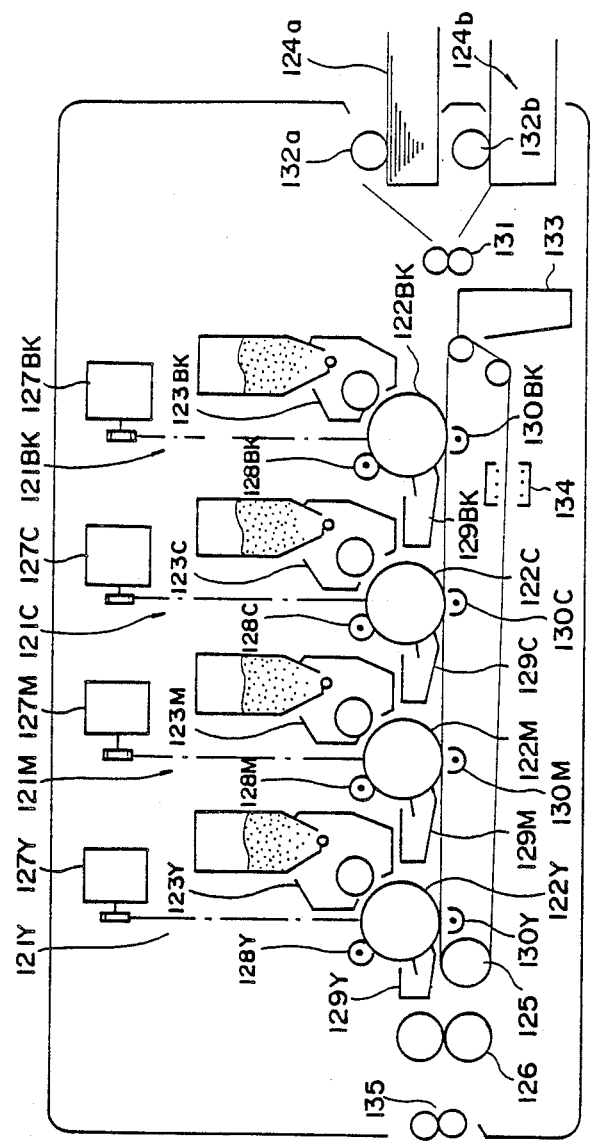
FIG. 13 is a cross sectional view showing a color printer from a front thereof which may be applied with the present invention.
Figure 14:
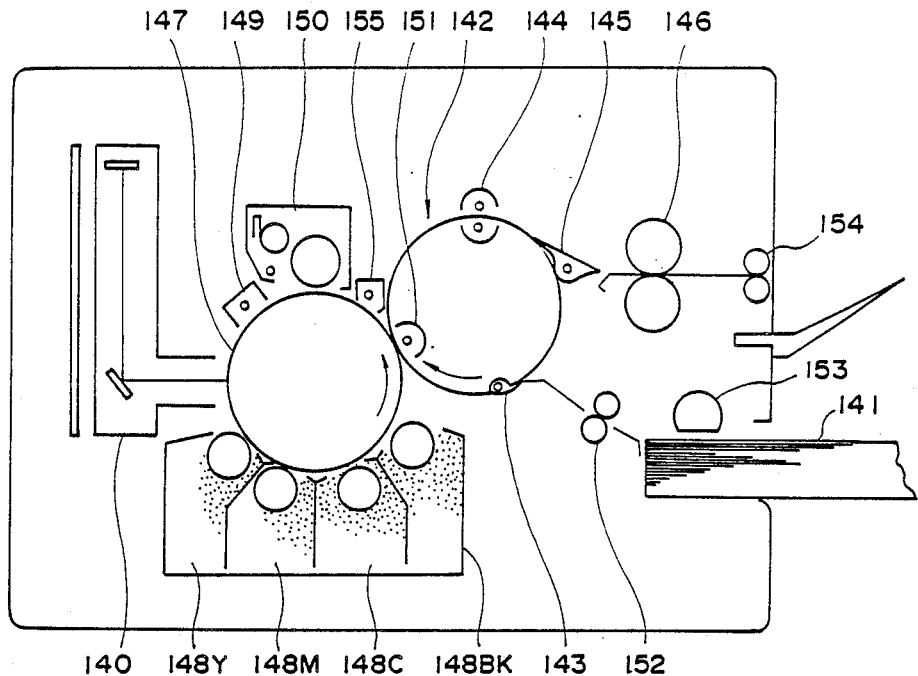
FIG. 14 is a cross sectional view showing another color printer from a front thereof which may be applied with the present invention.

FIGS. 13 and 14 respectively show the color printers which may be applied with the present invention and having the optical system shown in FIG. 12.

In the color printers shown in FIGS. 13 and 14, the colors present in the image to be printed are separated into yellow (Y), magenta (M) and cyan (C). Image signals of yellow, magenta and cyan are respectively received through suitable interfaces, and single color images of yellow, magenta and cyan are generated based on the image signals. The full color image is obtained by overlapping the single color images of yellow, magenta and cyan. An image signal of black (Bk) is used in addition to the image signals of yellow, magenta and cyan. The image signal of black corresponds to an ink plate used in the color printing and enables the printing of a black image having a high quality.

When equal quantities of yellow, magenta and cyan are combined, the resulting color is black. This means that the same color can be described by a combination of black and two colors out of the yellow, magenta and cyan. The so-called UCR eliminates equal quantities of the yellow, magenta and cyan corresponding to the black, and the replaced black is the ink plate.

In the color printer using the semiconductor laser, there is an additional advantage besides the color reproducibility in that the toner consumption is reduced when the UCR is carried out. As a result, the thickness of the output printed image is reduced, and the fixing of the image is satisfactory. Hence, a toner image is generally formed four times and transferred four times onto the paper.

But because the full color image is obtained by overlapping the single color images of yellow, magenta, cyan and black, the color reproducibility is greatly dependent on the positioning accuracy of each single color image. The same situation occurs when obtaining the full color image by overlapping the single color images of yellow, magenta and cyan, and the required accuracy of overlapping the single color images in this case is only slightly lower due to the fact that only three single color images are overlapped.

In the color printer shown in FIG. 13, optical systems 121Bk, 121C, 121M and 121Y are respectively provided with respect to corresponding photosensitive drums 122Bk, 122C, 122M and 122Y. The electrostatic images are formed on the photosensitive drums 122Bk, 122C, 122M and 122Y with slight timing differences and developed by corresponding developers 123Bk, 123C, 123M and 123Y. The toner images of black, cyan, magenta and yellow are successively transferred onto a sheet of paper 124a or 124b which is transported on a transfer belt 125 and is fixed by a fixing unit 126.

The optical systems 121Bk, 121C, 121M and 121Y respectively have deflectors 127Bk, 127C, 127M and 127Y and have the structure described in conjunction with FIG. 12. However, it is of course possible to use one or two deflectors and one or two imaging lenses in common as the four deflectors and four imaging lenses. But in this case, because each optical system has the semiconductor laser and the synchronous detection device for each color, it becomes difficult to accurately overlap the single color images and troublesome operations become necessary to control the positions of the single color images.

In FIG. 13, the color printer also includes chargers 128Bk, 128C, 128M and 128Y, cleaning units 129Bk, 129C, 129M and 129Y, transfer dischargers 130Bk, 130C, 130M and 130Y, paper feeding rollers 131, paper supplying rollers 132a and 132b, a belt cleaner 133, a belt discharger 134, and paper ejecting rollers 135.

On the other hand, the color printer shown in FIG. 14 only has a single optical system 140. Hence, when the formation and developing of a single color image is completed, a sheet of paper 141 is clamped on a transfer drum 142 by a clamper 143 and the toner image is transferred onto the paper 141. When the transfer of the toner image is carried out with respect to four colors, the paper 141 is released from the clamper 143 and is separated from the transfer drum 142 by way of a discharger 144 and a separation claw 145. The toner image on the paper 141 is fixed by a fixing unit 146.

In FIG. 14, the color printer also includes a photosensitive drum 147, developers 148Y, 148M, 148C and 148Bk, a charger 149, a cleaning unit 150, a discharger 151, paper feeding rollers 152, a paper supplying roller 153, paper ejecting rollers 154, and a discharger 155.

Figure 1:
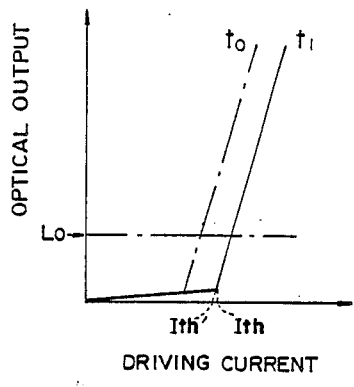
FIG. 1 shows a driving current versus optical output characteristic of a semiconductor laser.
Figure 2:
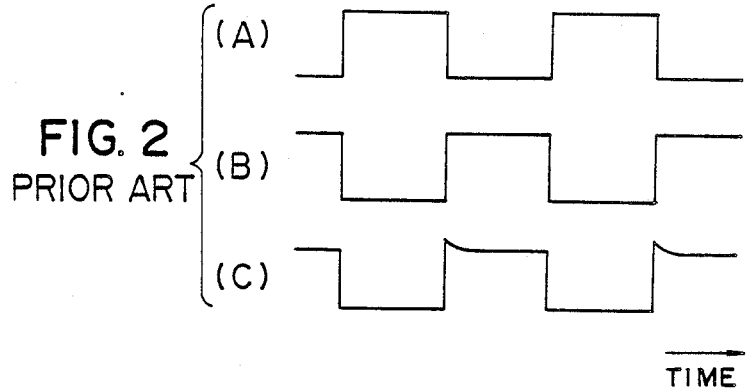
FIGS. 2(A) through 2(C) are timing charts for explaining a change introduced in an optical output of the semiconductor laser.
Figure 3:
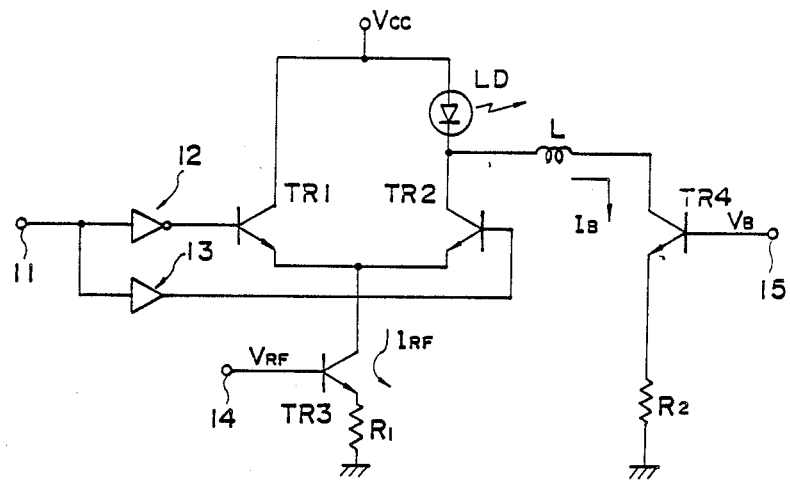
FIG. 3 is a circuit diagram showing an example of a conventional semiconductor laser control apparatus.
Figure 4:
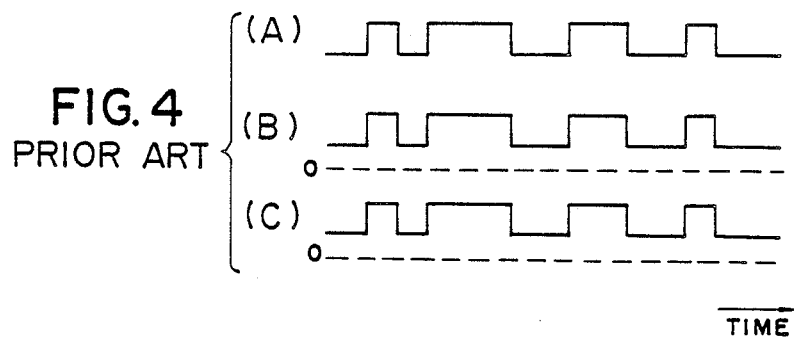
FIGS. 4(A) through 4(C) are timing charts for explaining an operation of the conventional semiconductor laser control apparatus shown in FIG. 3.

Next, a description will be given of a third embodiment of the semiconductor laser control apparatus according to the present invention. FIG. 15 shows the third embodiment, and FIGS. 16(A) through 16(E) are timing charts for explaining an operation of the third embodiment. In FIG. 15, those parts which are essentially the same as those corresponding parts in FIG. 3 are designated by the same reference numerals, and a description thereof will be omitted. Three constant current supply circuits are provided in FIG. 15, but it is of course possible to provide an appropriate number of constant current supply circuits depending on the required gradation.

The third embodiment differs from the conventional semiconductor laser control apparatus in that a constant current supply part 157 indicated by a phantom line is provided in place of the transistor TR3 and the resistor R1. The constant current supply part 157 has transistors TR10, TR11 and TR12 which are coupled in parallel, and resistors R10, R11 and R12 grounding emitters of the corresponding transistors TR10, TR11 and TR12. Collectors of the transistors TR10, TR11 and TR12 are coupled in common to the emitters of the transistors TR1 and TR2. Bases of the transistors TR10, TR11 and TR12 are respectively coupled to input terminals $158_0$, $158_1$ and $158_2$. Data bits D0, D1 and D2 are respectively applied to the input terminals, and for example, (D2, D1, D0)=(1, 0, 1) indicates that the data bit D2 has a high level, the data bit D1 has a low level and the data bit D0 has a high level.

For example, the data bits D0 through D3 are picture element data describing the gradation in eight gradation levels. Although not shown in FIG. 15, a data conversion (or processing) circuit is provided in a stage prior to the input terminal 11. The picture element data having the gradation information is processed in the data conversion (or processing) circuit into the data bits D0 through D3 for use in the pulse width and power modulations.

When (D2, D1, D0)=(1, 0, 1) and the transistor TR2 is turned ON responsive to the image signal received through the input terminal 11, a driving current I(D2, D1, D0)=I(1, 0, 1)=I10+I11+I12 flows to the semiconductor laser LD during a time corresponding to a pulse width of the image signal, where I10 denotes a current flowing through the transistor TR10, I11 denotes a current flowing through the transistor TR11 and I12 denotes a current flowing through the transistor TR12. The quantity of light emitted from the semiconductor laser LD decreases when the driving current decreases, and the quantity of light emitted increases when the driving current increases.

The currents I10, I11 and I12 are determined by the transistors TR10, TR11 and TR12 and the resistors R10, R11 and R12. When a ratio of the resistances of the resistors R10, R11 and R12 are set to R10:R11:R11=4:2:1, the driving currents I(D2, D1, D0) have such magnitudes that I(0, 0, 1)<I(0, 1, 0)<I(0, 1, 1)<I(1, 0, 0)<I(1, 0, 1)<I(1, 1, 0)<I(1, 1, 1). A description will now be given of the operation of the semiconductor laser control apparatus in this case by referring to FIGS. 16(A) through 16(E).

When the image signal is applied to the input terminal 11, the transistors TR1 and TR2 are turned ON/OFF alternately. When the transistor TR2 is ON and the transistor TR1 is OFF, the semiconductor laser LD is supplied with the current $I_{RF}$ which flows when the constant current supply part 157 having the transistors TR10, TR11 and TR12 and the resistors R10, R11 and R12 is switched responsive to the data bits D0, D1 and D2 and the bias current $I_B$ which flows due to the transistor TR4 and the resistor R2. Accordingly, it is possible to modulate the semiconductor laser LD by a combination of the modulation by the pulse width of the image signal applied to the input terminal 11 and the power modulation by the data bits D0, D1 and D2. For example, in a case where one dot is modulated in four stages of pulse widths and the power modulation is made by three bits which are D0, D1 and D2, it is possible to describe the dot in twenty-eight (=4×7) gradation levels. FIG. 16(A) shows an image signal a applied to the input terminal 11, FIGS. 16(B), 16(C) and 16(D) respectively show the data bits D0, D1 and D2 applied to the input terminals $158_0$, $158_1$ and $158_2$, and FIG. 16(E) shows an optical output C of the semiconductor laser LD.

Figure 17:
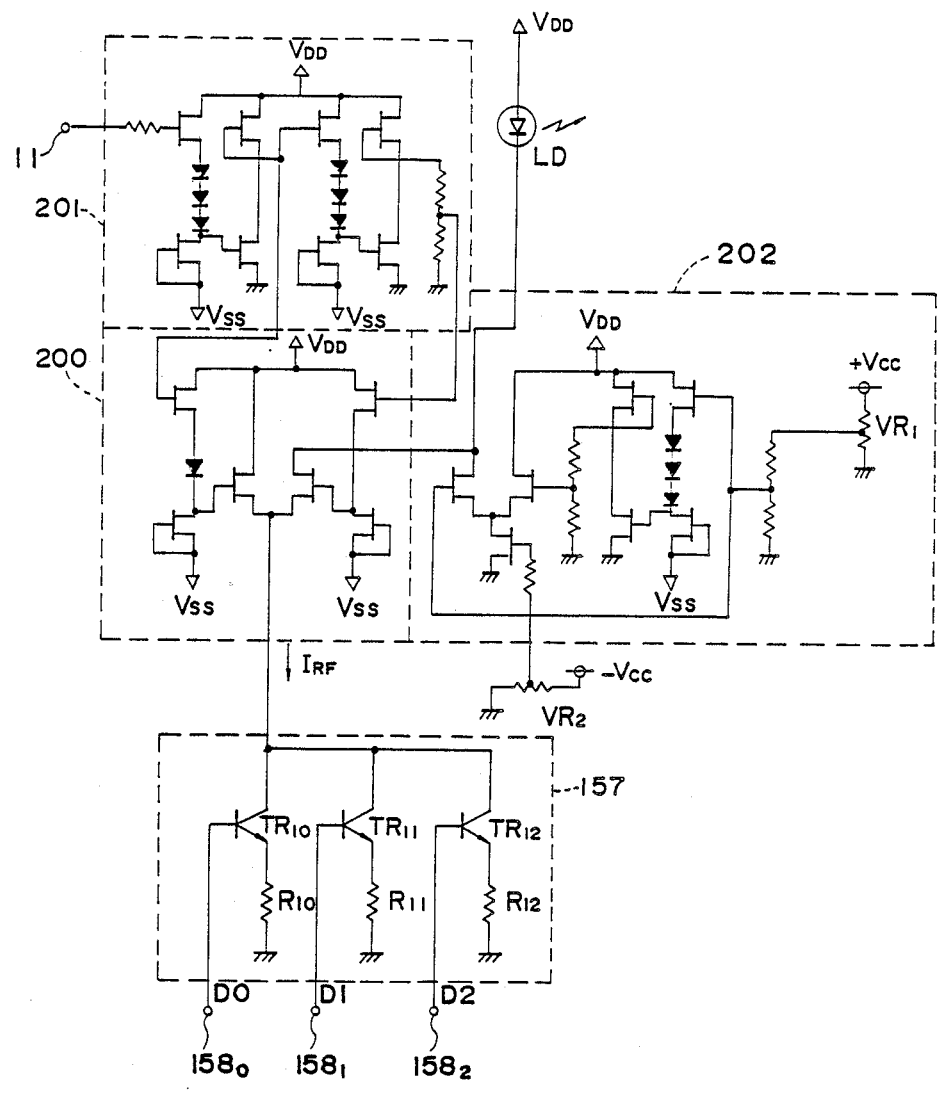
FIG. 17 is a circuit diagram showing a fourth embodiment of the semiconductor laser control apparatus according to the present invention.

FIG. 17 shows a fourth embodiment of the semiconductor laser control apparatus according to the present invention. The fourth embodiment is basically the same as the third embodiment, and in FIG. 17, those parts which are the same as those corresponding parts in FIG. 15 are designated by the same reference numerals, and a description thereof will be omitted.

In FIG. 17, a circuit part 200 corresponds to a circuit part shown in FIG. 15 including the transistors TR1 and TR2. A circuit part 201 corresponds to a circuit part shown in FIG. 15 including the inverter 12 and the amplifier 13. A circuit part 202 corresponds to a circuit part shown in FIG. 15 including the transistor TR4, the resistor R2 and the coil L. Further, $V_{DD}$ and $V_{SS}$ denote power source voltages. $V_{DD}$ may be set equal to Vcc, and $V_{SS}$ corresponds to the source potential of the field effect transistors (FETs).

The semiconductor laser LD is modulated by the image signal received at the input terminal 11. In this state, the power of the semiconductor laser LD is set by the current $I_{RF}$. In addition, the bias current $I_B$ is set by variable resistors VR1 and VR2.

In the third and fourth embodiments, both the pulse width and power of the modulation are varied. However, it is possible to keep the pulse width constant. It is of course also possible to keep the current setting of the constant current supply part constant and vary only the pulse width of the modulation.

Figure 18:
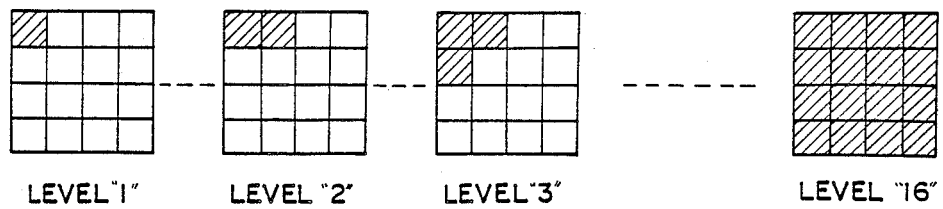
FIG. 18 is a diagram for explaining a conventional method of describing the gradation levels using a dither matrix.

In order to output from the printer having the two-level output an image described in a plurality of gradation levels such as a photograph, one picture element is conventionally constituted by a collection (matrix) of 4 dots×4 dots, for example, and 16 (=4×4) gradation levels are artifically described by forming or not forming each picture element by turning ON or turning OFF the semiconductor laser. For example, FIG. 18 shows a method of describing the gradation using a dither matrix. In FIG. 18, unhatched portions indicate the non-printed dots and the gradation level increases from "1" to "16" as the tone becomes darker. According to this conventional method, it is possible to describe 16 gradation levels but the size of the dither matrix must be increased if the image were to be described and outputted in a greater number of gradation levels. As a result, the resolution deteriorates as the number of gradation levels increases.

Figure 19:
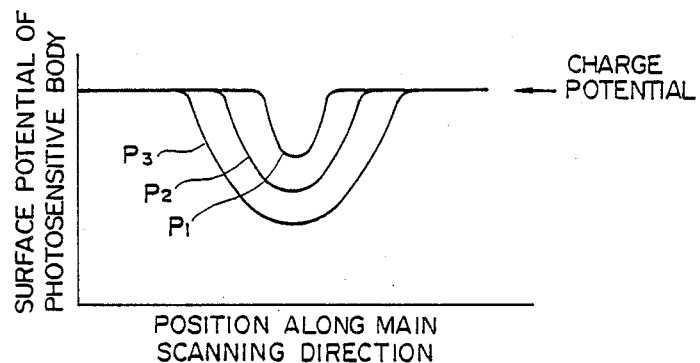
FIG. 19 is a graph showing a surface potential distribution of a photosensitive body with respect to a power of the semiconductor laser.

On the other hand, when scanning the surface of the photosensitive body by the laser beam, the surface potential distribution of the photosensitive body changes by varying the power of the semiconductor laser even when turning ON the semiconductor laser at the same position on the photosensitive body, as may be seen from FIG. 19. In FIG. 19, the abscissa indicates the position along a main scanning direction and the ordinate indicates the surface potential of the photosensitive body. FIG. 19 shows that the surface potential distribution of the photosensitive body differs for the cases where the power of the semiconductor laser is P1, P2 and P3.

Figure 20:
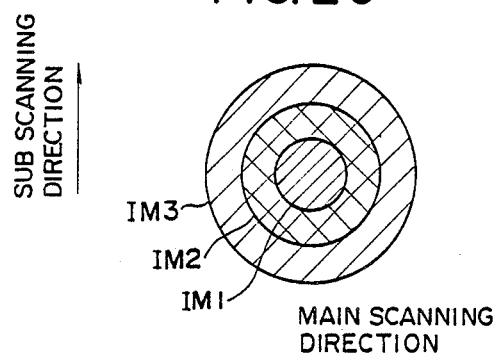
FIG. 20 is a diagram showing a toner image obtained with different powers of the semiconductor laser.

The larger the power (P1<P2<P3) of the semiconductor laser, the deeper the surface potential of the photosensitive body falls. For example, when when it is assumed that the negative-positive (N/P) development takes place, the toner image spreads as the surface potential of the photosensitive body deeply falls because of the quantity of toner which adheres on the paper increases. FIG. 20 shows the spreading of the toner image, where IM1, IM2 and IM3 respectively denote toner images obtained with the powers P1, P2 and P3 of the semiconductor laser.

Figure 21:
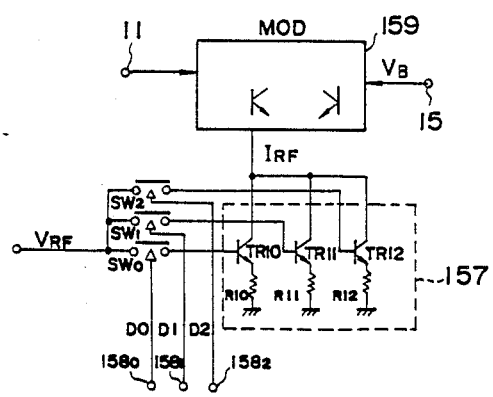
FIG. 21 is a circuit diagram showing a fifth embodiment of the semiconductor laser control apparatus according to the present invention.

FIG. 21 shows a fifth embodiment of the semiconductor laser control apparatus according to the present invention. In FIG. 21, those parts which are essentially the same as those corresponding parts in FIGS. 3 and 15 are designated by the same reference numerals, and a description thereof will be omitted. In the embodiment shown in FIG. 15, the data bits D0, D1 and D2 are supplied directly to the transistors TR10, TR11 and TR12 of the constant current supply part 157, and the logic levels of the data bits D0, D1 and D2 determine the setting of the constant current supply part 157. But generally, the data bits D0, D1 and D2 are obtained from an integrated circuit having a logic function and accuracy required of the voltages of these data bits D0, D1 and D2 are not very high. For this reason, it is preferable not to use the data bits D0, D1 and D2 themselves for the setting of the constant current supply part 157.

Hence, in the fifth embodiment, the reference voltage $V_{RF}$ received at the input terminal 14 is supplied to each of switches SW0, SW1 and SW2, and the data bits D0, D1 and D2 are used to control the switching of the corresponding switches SW0, SW1 and SW2. Analog switches using metal oxide semiconductor field effect transistors (MOSFETs), generally available complementary MOS (CMOS) integrated circuits and the like may be used for the switches SW0, SW1 and SW2. A modulating part 159 corresponds to the circuit part shown in FIG. 15 including the inverter 12, the amplifier 13, the transistors TR1, TR2 and TR4, the resistor R2, the coil L, and the semiconductor laser LD.

Therefore, according to the third through fifth embodiments, it is possible to describe the gradation in a plurality of gradation levels by one dot using the plurality of data bits.

Figure 22:
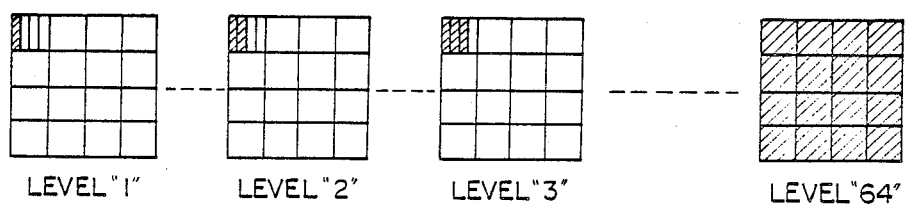
FIG. 22 a diagram for explaining a method of describing the gradation levels by the present invention in combination with the conventional method using the dither matrix.

In addition, it is also possible to describe the gradation in combination with the conventional method described in conjunction with FIG. 18. For example, one dot can be described by switching the power of the semiconductor laser in four stages and describing the gradation using the 4×4 dither matrix, as shown in FIG. 22. In this case, it is possible to describe sixty-four (=4×4×4) gradation levels by use of the 4×4 dither matrix.

Therefore, according to the third through fifth embodiments, there is provided a laser modulation circuit having both the pulse width modulation and power modulation of the semiconductor laser. For this reason, it is possible to obtain a picture having a high resolution and described with a large number of gradation levels compared to the conventional apparatus. Furthermore, unlike in the conventional intensity modulation method, it is possible to modulate the intensity with a satisfactory reproducibility with ease by applying the digital data and not analog data.

In the first embodiment, a plurality of switching elements are provided between the semiconductor laser and a plurality of constant current supply circuits and the switching elements are turned ON/OFF responsive to the information signal so as to control the currents supplied by the constant current supply circuits for every predetermined time period, thereby controlling the optical output of the semiconductor laser to a predetermined value. But when the number of levels of the optical output becomes large, the number of D/A converters and transistors for modulation becomes large and the scale of the circuit becomes considerably large.

Next, a description will be given of sixth and seventh embodiments of the semiconductor laser control apparatus in which the above described problem is eliminated.

Figure 23:
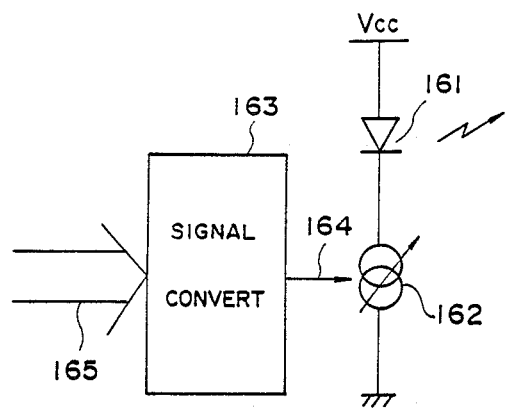
FIG. 23 is a system block diagram showing a sixth embodiment of the semiconductor laser control apparatus according to the present invention.
Figure 24:
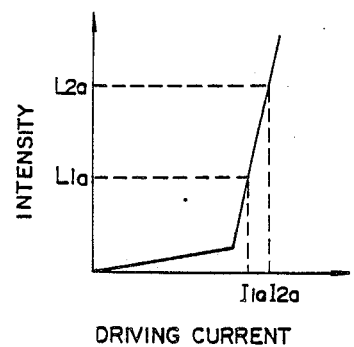
FIG. 24 is a graph showing a driving current versus intensity of optical output of the semiconductor laser in the sixth embodiment.

FIG. 23 shows the sixth embodiment of the semiconductor laser control apparatus according to the present invention. In FIG. 23, a variable current source 162 is coupled in series to a semiconductor laser 161. An optical output of the semiconductor laser 161 corresponds to a driving current supplied from the variable current source 162, and FIG. 24 shows a relationship between the driving current and an intensity of the optical output of the semiconductor laser 161. A current source control signal 164 is supplied to the variable current source 162 from a signal converting circuit 163 so as to control the driving current.

In FIG. 24, I1a and I2a denote arbitrary driving currents of the semiconductor laser 161, and L1a and L2a respectively denote intensities of the optical outputs of the semiconductor laser 161 obtained with the driving currents I1a and I2a.

Figure 25:
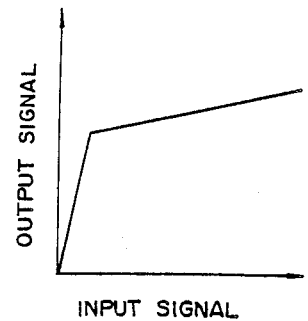
FIG. 25 is a graph showing an input signal versus output signal characteristic of a signal converting circuit of the sixth embodiment.

A multi-level digital image signal 165 is applied to the signal converting circuit 163. FIG. 25 shows a relationship between the multi-level digital image signal 165 and the current source control signal, that is, the input signal versus output signal characteristic of the signal converting circuit 163. The relationship shown in FIG. 25 is in correspondence with the relationship shown in FIG. 24, and from these two relationships the multi-level digital image signal and the driving current from the variable current source 162 linearly correspond to each other.

FIG. 26A shows the level of the current source control signal outputted from the signal converting circuit 163 when the multi-level digital image signal has five levels ("0" to "4"), for example. FIG. 26B shows the relationship between the intensity of the optical output of the semiconductor laser 161 and the driving current based on the current source control signal level shown in FIG. 26A. In FIGS. 26A and 26B, $O_0$ through $O_4$ denote the levels of the current source control signal and L0 through L4 denote the intensities of the optical output of the semiconductor laser 161.

Next, a description will be given of a seventh embodiment of the semiconductor laser control apparatus according to the present invention. FIG. 27 shows the seventh embodiment, wherein those parts which are essentially the same as those corresponding parts in FIG. 23 are designated by the same reference numerals, and a description thereof will be omitted.

In FIG. 27, a signal converting circuit 163a is also supplied with a conversion data 166 which is used to change the relationship between the multi-level digital image signal 165 and the current source control signal 164. The multi-level digital image signal 165 is also supplied to a reference signal generating circuit 167 which generates a reference signal (voltage) which has a linear relationship with the multi-level digital image signal 165.

On the other hand, a photodiode 168 for monitoring is provided with respect to the semiconductor laser 161. The photodiode 168 outputs a signal proportional to an intensity of the optical output of the semiconductor laser 161. The output signal of the photodiode 168 is amplified by an amplification A in an amplifier 169 and is supplied to a comparator 170. The comparator 170 compares the output signal of the amplifier 169 with the reference signal and outputs a signal which indicates whether the output signal of the photodiode 168 indicative of the optical output of the semiconductor laser 161 is less than or greater than the reference signal (or whether or not the output signal of the amplifier 169 falls within a predetermined range). The output signal of the comparator 170 is supplied to a central processing unit CPU 171 which monitors this signal and outputs the conversion data 166.

Figure 28:
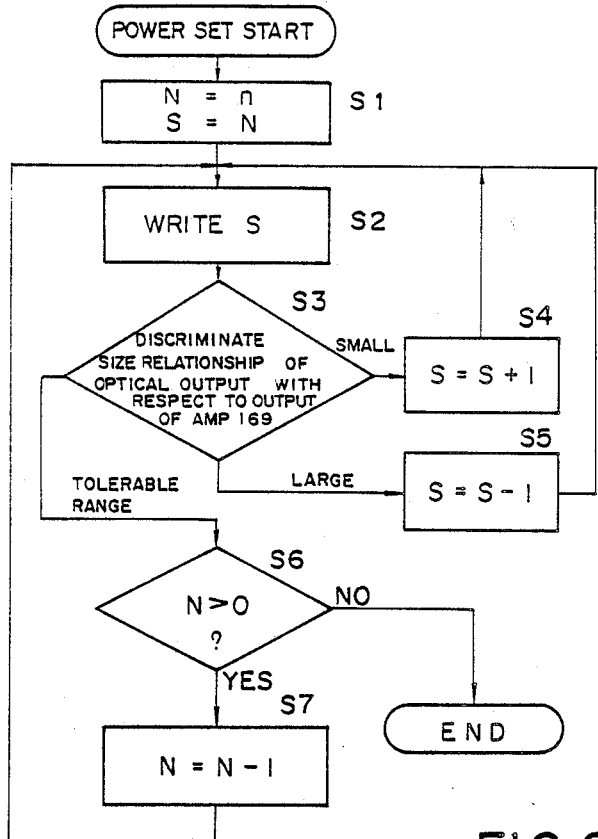
FIG. 28 is a flow chart for explaining an operation of the seventh embodiment.

Next, a description will be given of the operation of the seventh embodiment by referring to a flow chart shown in FIG. 28. FIG. 28 shows an operation of the CPU 171 shown in FIG. 27. When a power set operation starts, a step S1 sets input signal value N (multi-level digital image signal 165) to a maximum value n and also sets a conversion data S (conversion data 166) to the input signal value N. A step S2 writes the conversion data S into the signal converting circuit 163a. Hence, the signal converting circuit 163a converts the input signal value N depending on the conversion data S and outputs the current source control signal 164. As a result, the driving current is generated from the variable current source 162 dependent on the current source control signal 164 and the semiconductor laser 161 generates the optical output. A step S3 compares the output signal of the amplifier 169 indicative of the optical output of the semiconductor laser 161 with the reference signal outputted from the reference signal generating circuit 167 indicative of the original multi-level digital image signal. The referenc signal outputted from the reference signal generating circuit 167 corresponds to the input signal value N, and the comparator 170 outputs a signal indicative of a size relationship of the output signal of the amplifier 169 with respect to the reference signal. This size relationship is monitored on the CPU 171.

When the optical output is less than a predetermined value and the output signal of the amplifier 169 is less than the reference signal, the process advances to a step S4 which increments the conversion data S by one and the process returns to the step S2. On the other hand, when the optical output is greater than the predetermined value and the output signal of the amplifier 169 is greater than the reference signal, the process advances to a step S5 which decrements the conversion data S by one and the process returns to the step S2. Such an operation is repeated until the optical output becomes approximately the predetermined value and an error is within a tolerable range.

When the optical output falls within the tolerable range from the predetermined value, a step S6 discriminates whether or not the input signal value N is greater than "0". When the discrimination result in the step S6 is YES, a step S7 decrements the input signal value N by one and the process returns to the step S2. On the other hand, when the discrimination result in the step S6 is NO, the process is ended. Therefore, the steps S2 through S7 are repeated in each stage where the input signal value N varies from the maximum value n to "0" and the process is ended when the input signal value N becomes "0".

Figure 29:
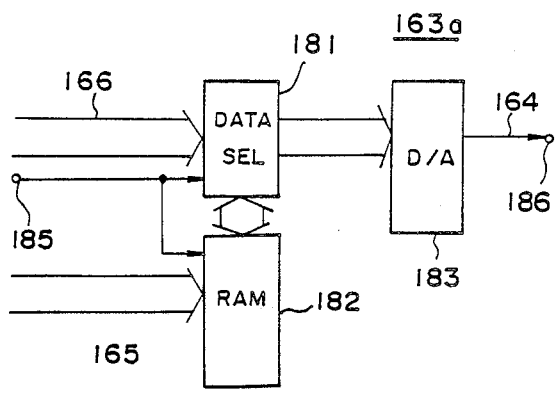
FIG. 29 is a system block diagram showing an embodiment of a signal converting circuit of the seventh embodiment.

FIG. 29 shows an embodiment of the signal converting circuit 163a of the seventh embodiment. The signal converting circuit 163a has a data selector 181, a random access memory (RAM) 182 and a digital-to-analog (D/A) converter 183. The multi-level digital image signal 165 is supplied to an address input side of the RAM 182, and the conversion data 166 is supplied to the data selector 181. An output of the data selector 181 is supplied to a data input side of the RAM 182. A write signal applied to an input terminal 185 is supplied to the data selector 181 and the RAM 182.

The data selector 181 has a function of supplying the conversion data 166 to the data input side of the RAM 182 and to the D/A converter 183 when the write signal is received from the input terminal 185. Accordingly, the conversion data 166 is written into the RAM 182 as the data corresponding to the multi-level digital image signal 165. In addition, during a time period in which no write signal is received at the input terminal 185, the data selector 181 has a function of supplying the output data of the RAM 182 to the D/A converter 183. As a result, the data corresponding to the multi-level digital image signal 165 supplied to the address input side of the RAM 182 is supplied to the D/A converter 183. The current source control signal 164 is outputted from the D/A converter 183 and supplied to an output terminal 186.

When there is no change in the characteristic of the semiconductor laser 161, the conversion data in the signal converting circuit 163a may be fixed. In this case, a read only memory (ROM) may be used as the signal converting circuit 163a. In addition, although the step S1 shown in FIG. 28 makes the initial setting S=N=n, the conversion data S may be set to any appropriate value.

Further, the present invention is not limited to these embodiments, but various variations and modifications may be made without departing from the scope of the present invention.

What is claimed is:

1. A semiconductor laser control apparatus for controlling an optical output of a semiconductor laser to a predetermined value, said semiconductor laser control apparatus comprising:
    switching means coupled in series with the semiconductor laser and controlled by an N-bit image signal;
    N constant current supply circuits coupled in parallel to each other and in series with said switching means for supplying currents to said switching means so that a driving current is supplied to the semiconductor laser from said switching means;
    detector means for detecting the optical output of the semiconductor laser and for outputting a detection signal indicative of the detected optical output; and
    control means responsive to the detection signal from said detector means for controlling the driving current by controlling said N constant current supply circuits so that the optical output of the semiconductor laser becomes the predetermined value.

2. A semiconductor laser control apparatus as claimed in claim 1 in which said switching means includes N switching elements respectively supplied and controlled with a corresponding one of the N-bit image signal and respectively coupled in series with a corresponding one of said N constant current supply circuits.

3. A semiconductor laser control apparatus as claimed in claim 1 in which said N constant current supply circuits includes a predetermined constant current supply circuit for supplying a bias current to the semiconductor laser through said switching means, said control means controlling at least said predetermined constant current supply circuit so that the detection signal from said detector means becomes equal to a predetermined reference value.

4. A semiconductor laser control apparatus as claimed in claim 1 in which said control means controls said N constant current supply circuits so that the detection signal from said detector means becomes equal to an ith predetermined reference value when an ith constant current supply circuit out of said N constant current supply circuits is enabled responsive to the N-bit image signal.

5. A semiconductor laser control apparatus as claimed in claim 1 in which said N constant current supply circuits respectively supply currents $I_1$ through $I_N$ to said switching means, said current $I_1$ being a bias current for the semiconductor laser, said control means controlling said N constant current supply circuits so that the driving current supplied from said switching means is set to one of $2^N$ values depending on the value of said N-bit image signal.

6. A semiconductor laser control apparatus as claimed in claim 5 in which N=2 and said control means controls said N constant current supply circuits so that the driving current supplied from said switching means is zero when said N-bit image signal has a first value and is $I_1+I_2$ when said N-bit image signal has a second value.

7. A semiconductor laser control apparatus as claimed in claim 5 in which N=4 and said control means controls said N constant current supply circuits so that the driving current supplied from said switching means is zero when said N-bit image signal has a first value, $I_1+I_2$ when said N-bit image signal has a second value, $I_1+I_3$ when said N-bit image signal has a third value, and $I_1+I_2+I_3$ when said N-bit image signal has a fourth value.

8. A semiconductor laser control apparatus as claimed in claim 1 in which said N constant current supply circuits includes a first constant current supply circuit for supplying a bias current to the semiconductor laser through said switching means, said control means controlling said first constant current supply circuit so that the detection signal from said detector means becomes equal to a predetermined reference value, remaining second through Nth constant current supply circuits supplying such currents that a second constant current supply circuit supplies a current I and an Nth constant current supply circuit supplies a current $2^{N-2}I$, where N=3, ..., and I is an arbitrary value.

9. A semiconductor laser control apparatus as claimed in claim 1 in which said N constant current supply circuits respectively supply currents $I_1$ through $I_N$ to said switching means, said current $I_1$ being a bias current for the semiconductor laser, said control means controlling said N constant current supply circuits so that the driving current supplied from said switching means is set to one of $2^N$ values depending on the value of said N-bit image signal, where a second constant current supply circuit supplies a current $I_2$ and an Nth constant current supply circuit supplies a current $I_N=2^{N-2}I_2$, N=3, ....

10. A semiconductor laser control apparatus as claimed in claim 9 in which N=2 and said control means controls said N constant current supply circuits so that the driving current supplied from said switching means is zero when said N-bit image signal has a first value and $I_1+I_2$ when said N-bit image signal has a second value.

11. A semiconductor laser control apparatus as claimed in claim 9 in which N=4 and said control means controls said N constant current supply circuits so that the driving current supplied from said switching means is zero when said N-bit image signal has a first value, $I_1+I_2$ when said N-bit image signal has a second value, $I_1+I_3$ when said N-bit image signal has a third value, and $I_1+I_2+I_3$ when said N-bit image signal has a fourth value.

12. A semiconductor laser control apparatus as claimed in claim 1 in which said control means includes a correction circuit for correcting a change in the optical output of the semiconductor laser due to a thermal coupling.

13. A semiconductor laser control apparatus for controlling an optical output of a semiconductor laser to a predetermined value, said semiconductor laser control apparatus comprising:
switching means coupled in series with the semiconductor laser and controlled by an image signal;
variable current supply means coupled in series with said switching means for supplying a driving current to the semiconductor laser through said switching means; and
terminal means for receiving data bits for controlling said variable current supply means.

14. A semiconductor laser control apparatus as claimed in claim 13 in which said variable current supply means includes a plurality of constant current supply circuits which are coupled in parallel to each other and coupled in series to said switching means, each of said constant current supply circuit being controlled responsive to a corresponding one of said data bits.

15. A semiconductor laser control apparatus for controlling an optical output of a semiconductor laser to a predetermined value, said semiconductor laser control apparatus comprising:
first switching means coupled in series with the semiconductor laser and controlled by an image signal;
variable current supply means coupled in series with said switching means for supplying a driving current to the semiconductor laser through said first switching means;
second switching means coupled to said variable current supply means and supplied with a reference signal for selectively supplying the reference signal to said variable current supply means responsive to control signals; and
terminal means for receiving data bits which are supplied to said second switching means as the control signals so as to control the driving current supplied from said variable current supply means.

16. A semiconductor laser control apparatus as claimed in claim 15 in which said variable current supply means includes a plurality of constant current supply circuits which are coupled in parallel to each other and coupled in series to said first switching means, and said second switching means includes a number of switches identical to a number of said constant current supply circuits for selectively outputting the reference signal depending on a logic value of said data bits, each of said constant current supply circuits being controlled responsive to an output of a corresponding one of said switches of said second switching means.

17. A semiconductor laser control apparatus for controlling an optical output of a semiconductor laser to a predetermined value, said semiconductor laser control apparatus comprising:

signal converting means for converting a multi-level digital image signal into a current source control signal; and a variable current source for supplying a driving current to the semiconductor laser responsive to the current source control signal, said signal converting means controlling said variable current source by said current source control signal so that the driving current linearly corresponds to said multi-level digital image signal.

18. A semiconductor laser control apparatus as claimed in claim 17 in which said signal converting means includes a table for converting said multi-level digital image signal into said current source control signal.

19. A semiconductor laser control apparatus for controlling an optical output of a semiconductor laser to a predetermined value, said semiconductor laser control apparatus comprising:

signal converting means supplied with a multi-level digital image signal and a conversion data for converting the multi-level digital image signal into a current source control signal based on the conversion data;

a variable current source for supplying a driving current to the semiconductor laser responsive to the current source control signal;

reference signal generating means supplied with the multi-level digital image signal for generating a reference signal which corresponds linearly to said multi-level digital image signal;

detector means for detecting the optical output of the semiconductor laser and for outputting a detection signal indicative of the detected optical output; and control means responsive to the detection signal from said detector means for controlling the driving current by varying said conversion data so that levels of the detection signal and the reference signal coincide and the optical output of the semiconductor laser becomes the predetermined value, said signal converting means controlling said variable current source by said current source control signal so that the driving current linearly corresponds to said multi-level digital image signal.

20. A semiconductor laser control apparatus as claimed in claim 19 in which said signal converting means includes a table for converting said multi-level digital image signal into said current source control signal.

* * * * *